United States Patent
Takagishi (10) Patent No.: US 10,433,062 B2
(45) Date of Patent: Oct. 1, 2019

(54) STEREO AUDIO SYSTEM AND METHOD

(71) Applicant: DIODES INCORPORATED, Plano, TX (US)

(72) Inventor: Hideto Takagishi, San Jose, CA (US)

(73) Assignee: DIODES INCORPORATED, Plano, TX (US)

(*) Notice: Subject to any disclaimer, the term of this patent is extended or adjusted under 35 U.S.C. 154(b) by 0 days.

(21) Appl. No.: 15/870,757

(22) Filed: Jan. 12, 2018

(65) Prior Publication Data

US 2019/0222937 A1 Jul. 18, 2019

(51) Int. Cl.
| | |
|---|---|
| *H04R 5/04* | (2006.01) |
| *H03G 3/00* | (2006.01) |
| *H03G 1/00* | (2006.01) |
| *H04R 3/12* | (2006.01) |

(52) U.S. Cl.
CPC ............ *H04R 5/04* (2013.01); *H03G 1/0005* (2013.01); *H03G 3/007* (2013.01); *H04R 3/12* (2013.01)

(58) Field of Classification Search
CPC ... H04R 5/04; H04R 5/00; H04R 3/12; H04R 5/033; H04S 1/00; H04S 1/002; H04S 1/005; H03G 1/00; H03G 1/0005; H03G 3/007
USPC ............................................................. 381/17
See application file for complete search history.

(56) References Cited

U.S. PATENT DOCUMENTS

| | | | | |
|---|---|---|---|---|
| 4,819,269 | A * | 4/1989 | Klayman | H04S 3/00 381/302 |
| 5,610,986 | A * | 3/1997 | Miles | H04S 3/02 381/1 |
| 6,169,812 | B1 * | 1/2001 | Miller | H04R 5/02 381/1 |
| 2004/0091121 | A1 * | 5/2004 | Morimoto | H04S 1/00 381/74 |

* cited by examiner

*Primary Examiner* — Jason R Kurr (57) ABSTRACT

A circuit receives a first input signal and a second input signal, and provides three driving signals to three output wires, respectively. A first driving signal is provided to a first output wire, and is based on a difference between the first input signal and the second input signal. A second driving signal is provided to a second output wire, and is based on a sum of the first input signal and the second input signal. A third driving signal is provided to a third output wire, and is based on an inverse of the first driving signal. A first output signal between the first output wire and the second output wire is based on the second input signal. A second output signal between the third output wire and the second output wire is based on the first input signal.

11 Claims, 9 Drawing Sheets

STEREO AUDIO SYSTEM AND METHOD

FIELD OF INVENTION

This invention is directed to electronic circuits and systems. More specifically, this invention is directed to systems and methods for a stereo audio system.

BACKGROUND OF THE INVENTION

Figure 1A:
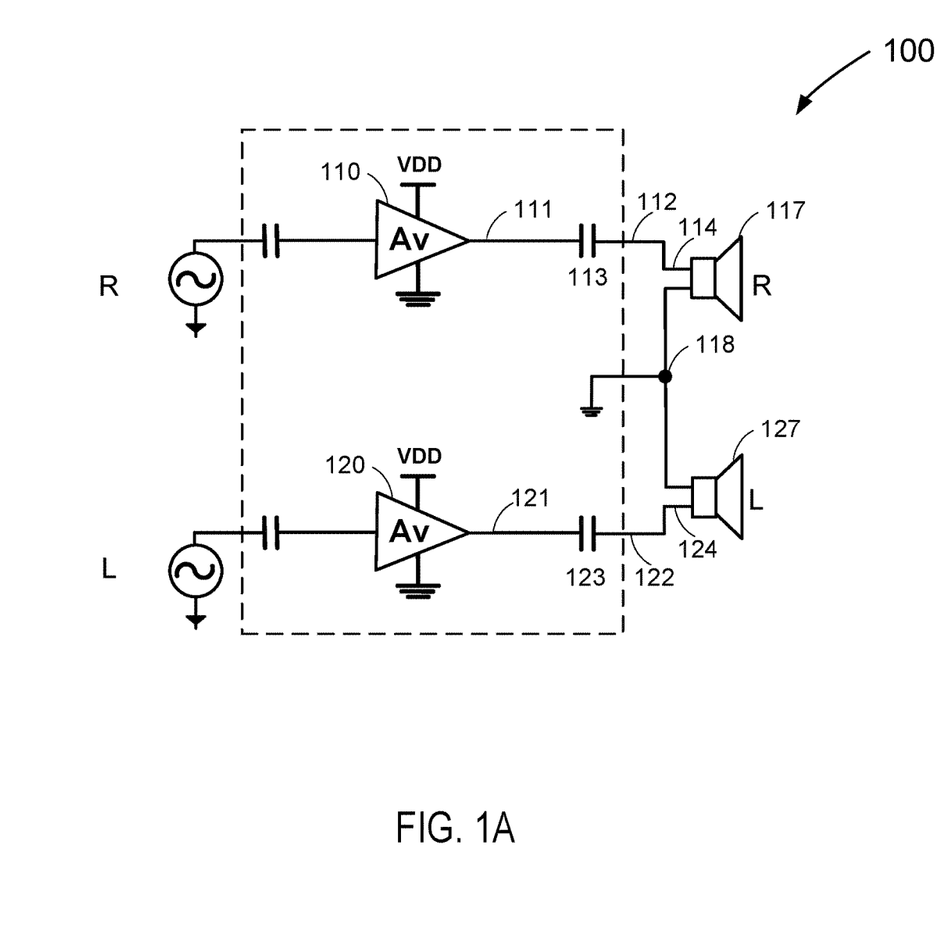
FIG. 1A illustrates a conventional stereo audio system having two single-ended amplifiers in a three-wire configuration.

FIG. 1A illustrates a standard commercial stereo audio system 100. It comprises two single-ended amplifiers 110 and 120 (usually housed in the same power amplifier unit as two symmetrical portions of the same circuit) to amplify the left and right audio signals, R and L, separately. The two amplifiers provide amplified audio signals 111 and 121, respectively, on two separate wires 112 and 122, plus a common ground wire 118 to the two speakers 117 and 127. At the speaker end, there are three wires, wire 114 for the right-channel terminal, wire 124 for the left-channel terminal, and wire 118 for the common-ground terminal. The three-wire configuration has become the standard of the audio consumer systems including the headphones. This standard audio system needs blocking capacitors 113 and 123, in order to remove DC bias in audio signals 111 and 121 to generate audio signals 112 and 122.

Figure 1B:
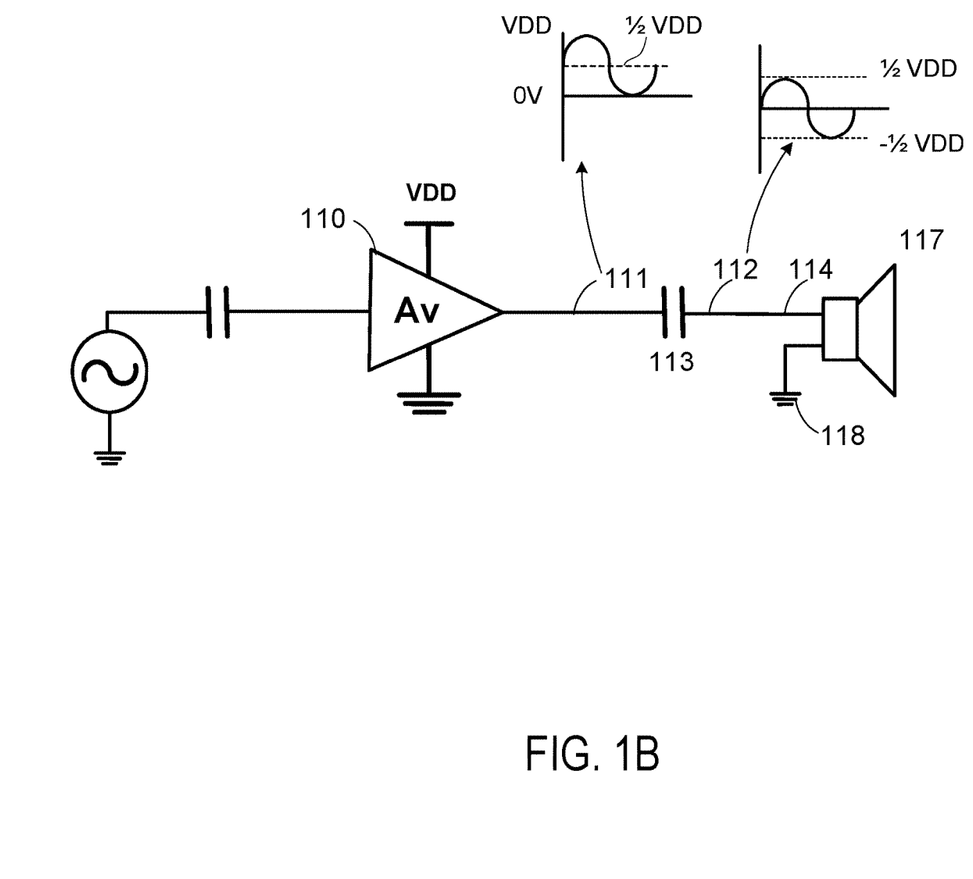
FIG. 1B is a simplified schematic diagram of a conventional single-ended amplifier illustrating the function of the output blocking capacitor.

As illustrated in FIG. 1B, power amplifier 110 operates with a power supply VDD, e.g., 5 V. The audio signal 111 at the output of power amplifier 110 has a DC bias of ½*VDD, e.g., 2.5 V. In other words, audio signal 111 can vary between 0 V and 5 V, with a voltage swing of ±2.5 V centered at a bias voltage of 2.5 V. If audio signal 111 is connected directly to speaker 117, which has a wire 118 connected to ground, a 2.5 V DC bias voltage is constantly applied to wire 114 of speaker 117. A large current will flow in the speaker constantly, and the vibrating membrane in the speaker will be constantly stretched and thus prone to damage. In this case, a blocking capacitor 113 is used to remove the DC bias, and provides AC audio signal 112, which has an alternating amplitude of ±2.5 V centered at 0 V. Therefore, a blocking capacitor is required in the audio systems of FIGS. 1A and 1B to remove the DC bias voltage. The performance of the output blocking capacitors is described in FIG. 2.

Figure 2:
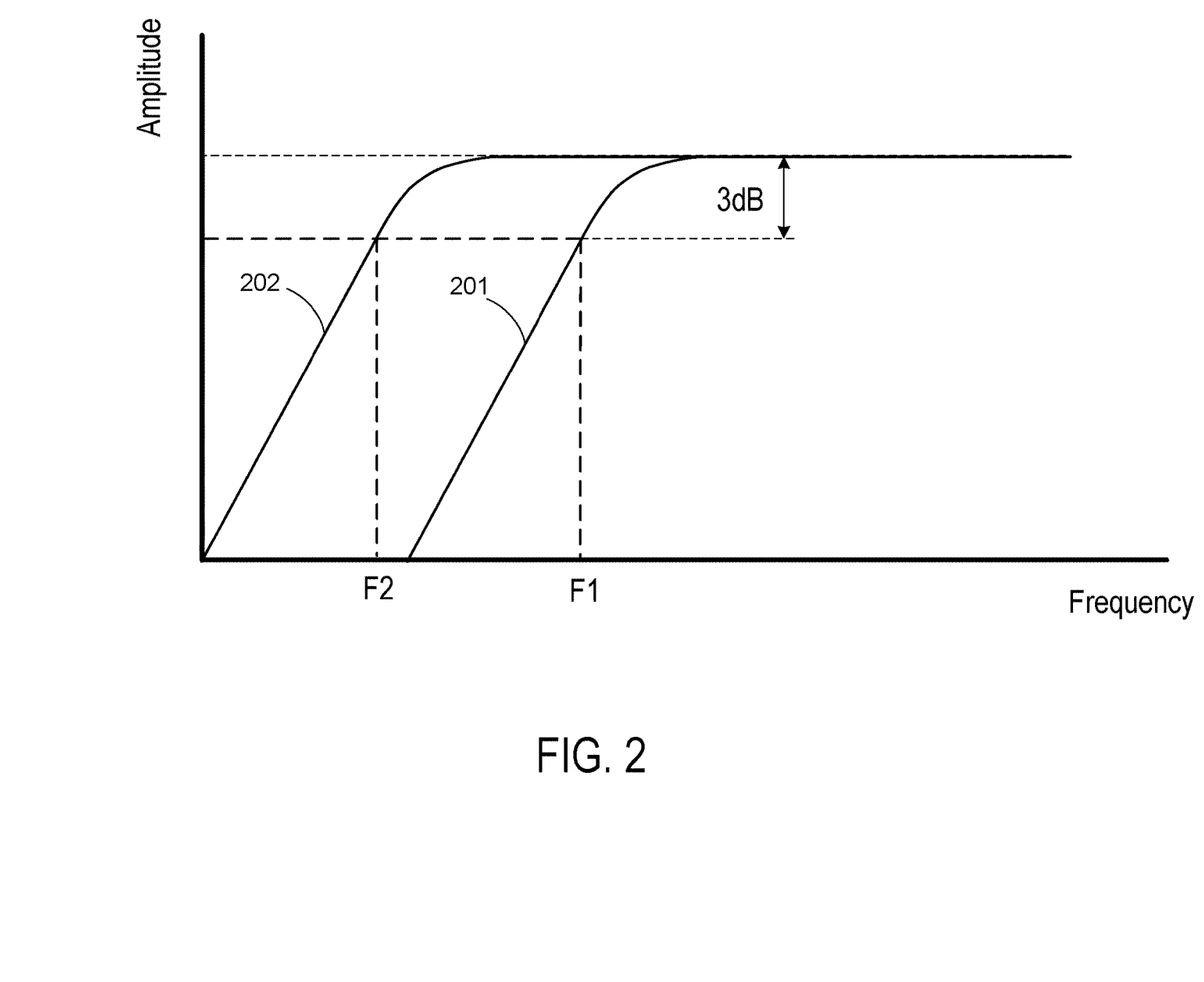
FIG. 2 illustrates examples of frequency response curves of high-pass filters with different blocking capacitors.

FIG. 2 illustrates the frequency responses of two high-pass circuits. Curve 201 illustrates the frequency response of a high-pass circuit having a cutoff frequency F1. Curve 202 illustrates the frequency response of a high-pass circuit having a lower cutoff frequency F2. To achieve better performance at lower frequencies, a low cut off frequency is desired in a high-fidelity audio system. The cutoff frequency is determined by the product of the capacitance of the blocking capacitor and the resistance of the speaker load. Consequently, for a speaker of a fixed resistance (e.g. 4Ω-32Ω), the blocking capacitors have to be of a reasonably large value, for example, 100 μF to 400 μF.

In another example, a dual power supply that has, e.g., +2.5 V and −2.5 V power supplies, can be used in an audio system for providing AC audio signal having an alternating amplitude of ±2.5 V centered at 0 V. In this case, the audio system does not need the output blocking capacitors. However, this approach requires two separate power supplies and a more complex circuit.

Figure 3:
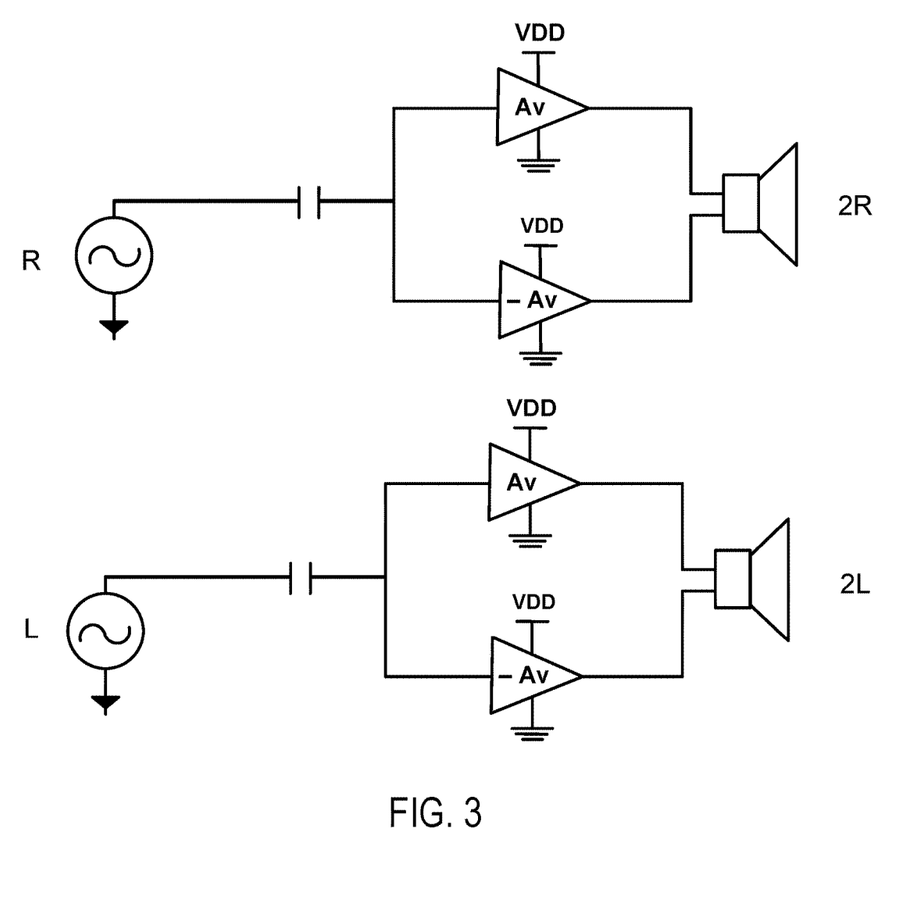
FIG. 3 illustrates a conventional stereo audio system with a bridge-tied-load (BTL) configuration.

FIG. 3 illustrates an alternative stereo audio system known as the bridge-tied-load (BTL) configuration. The BTL configuration can often be seen in professional audio and in some car audio systems. In a BTL system, the two channels of a stereo signal are separately fed to two amplifiers with opposite signal polarities, and the outputs of the two amplifiers are separately connected to the inputs of the speakers or headphones. The BTL system has the advantage over the three-wire system in that, since two amplifiers are used in opposite polarity for each channel using the same power supply, there is no need for the DC blocking capacitor between the amplifier and the speaker. However, the drawback of this system is that four wires are required, making it unsuitable for the standard 3-wire audio speakers.

Some conventional sound signal processing systems, such as Karaoke systems and FM (frequency modulation) radio, use combinations of left and right channel signals to form new signals. For example, an ordinary music with voice and instrument signals can be fed into a Karaoke system, which extracts the difference between the signals from the left and right channels to obtain an output that only has instrument signals with voice signals canceled. However, Karaoke systems are often equipped with the conventional monaural (mono) or single-channel speakers or the conventional BTL speaker system described above.

In FM radio systems, in order to make stereo broadcasts be compatible with mono receivers, the left (L) and right (R) channels are algebraically encoded into sum (L+R) and difference (L−R) signals. A mono receiver will use just the L+R signal so the listener will hear both channels through the single loudspeaker. A stereo receiver will add the difference signal to the sum signal to recover the left channel, and subtract the difference signal from the sum to recover the right channel. FM radio signals are still feeding into the conventional mono speakers or the BTL speaker system described above.

BRIEF SUMMARY OF THE INVENTION

The inventor has recognized that the conventional BTL system requires two signal wires for each audio channel and therefore requires four wires at the two stereo speakers or headphones. This is incompatible to the standard consumer audio equipment. Further, BTL systems use four power amplifiers, which increase the size and cost of the system and, in the case of IC circuits, increase the die size of the circuit.

The inventor has also recognized that the conventional three-wire speaker systems, with two speakers sharing a common ground connection, need blocking capacitors to block the DC bias voltage. Simple circuit theory reveals that in order to maintain high-fidelity, especially in the low frequency signal range, the output portion of the system circuit must have a large time constant to provide a low cutoff frequency. Typically, the blocking capacitor can have a capacitance of 100 μF to 400 μF. For example, a blocking capacitor of 220 μF and a 32Ω speaker can provide a cutoff frequency of approximately 20 Hz. For a speaker with lower resistance values, an even larger blocking capacitance will be required. Large capacitors have large physical sizes. For example, such blocking capacitors can have dimensions on the order of centimeters. The large capacitors increase the size and cost of the audio system, and can become especially burdensome as portable audio system headphones trend towards miniaturization. At present, the audio systems compromise between system size, cost, and signal fidelity.

This invention teaches a novel stereo audio system that only needs three output wires for connecting to two speakers for the right and left channels, respectively, without the need for blocking capacitors. The advantages of the novel audio system over conventional audio systems include the following. First, the novel audio system can eliminate the need for the blocking capacitors. The system can maintain a three-wire configuration and is compatible with existing three-wired audio equipment. Further, the novel audio system can provide twice the signal voltage, similar to a four-wire BTL audio system illustrated in FIG. 2, and can reduce the number of power amplifiers needed in the system from 4 to 3.

As an example, the invention teaches a circuit that has a first output wire, a second output wire, and a third output wire. The circuit receives a first input signal R and a second input signal L. The circuit provides a first driving signal to the first output wire, a second driving signal to the second output wire, and a third driving signal to the third output wire. The first driving signal is a linear function of the difference between the input signal R and the input signal L, the second driving signal is a linear function of the sum of the input signals R and L, and the third driving signal has a magnitude of the first driving signal and has an opposite polarity with respect to the first driving signal. The circuit provides a first output signal between the first output wire and the second output wire. The first output signal is a linear function of the input signal L and not a function of the input signal R. The circuit provides a second output signal between the third output wire and the second output wire. The second output signal is a linear function of the input signal R and not a function of the input signal L.

In the above description, a linear function of a signal S, can be expressed as aS+b, where a and b are constants. For example, the three driving signals can be expressed with the format of −a(R−L)+b, representing a multiple of −(R−L) plus a constant offset b. In a specific case where a=1 and b=0, the first driving signal is −(R−L). Similarly, the second driving signal is −(R+L), and the third driving signal is −(L−R). A first output signal between the first output wire and the second output wire is 2L, and a second output signal between the third output wire and the second output wire is 2R.

Further, for simplicity, the description of the invention may refer to a signal using a symbol, e.g., R, L, 2R, or 2L, or combinations of symbols, e.g., ±(R−L), —+(L−R), or ±(R+L), etc., to represent the magnitude of the signal. However, actual signals measured in circuit implementations may include deviations caused by component variations or changes with time. Therefore, it is understood that a symbolic representation of a signal value is meant to include reasonable deviations, which can be a tolerance specification of a system, for example, ±5% or ±10%. Further, the magnitude of the signal can also vary depending on the amplification factor of the circuit. Therefore, in the discussion below, these signals may be shown as ±a(R−L), ±a(L−R), ±a(R+L), 2bL, 2bR, etc., where a and b are constants.

A stereo audio system can include a circuit described above to receive a first input signal R and a second input signal L, and provide a first output signal 2bL to a first speaker and a second output signal 2bR to a second speaker. In this stereo audio system, the two speakers share a common wire, and no blocking capacitors are required. With amplifiers having different gains, the output signals can be amplified and attenuated versions of 2bL and 2bR, respectively.

In another example, the invention teaches a circuit that includes a first output wire, a second output wire, and a third output wire. The circuit receives a first input signal R and a second input signal L and provides three driving signals to the three output wires. A first driving signal based on −(R−L) is provided to the first output wire. A second driving signal based on −(R+L) is provided to the second output wire. A third driving signal based on −(L−R) is provided to the third output wire. As a result, the circuit provides a first output signal based on 2L between the first output wire and the second output wire. The circuit also provides a second output signal based on 2R between the third output wire and the second output wire.

It is noted, as used herein, a signal based on an expression of L and/or R means that the signal has the form of that expression and can have a magnitude proportional to the expression. For example, a signal based on −(R−L) may have a magnitude equal to −(R−L) or a scaled version of −(R−L).

The exemplary circuit can be connected to two speakers to provide stereo audio output signals such that the first output wire is coupled to a positive terminal of a first speaker, the second output wire is coupled to a negative terminal of the first speaker and to a negative terminal of a second speaker, and the third output wire is coupled to a positive terminal of the second speaker. In this manner, a first output signal based on 2L is provided to the first speaker without blocking capacitors. Further, a second output signal based on 2R is provided to the second speaker without blocking capacitors.

In an exemplary analog implementation, the circuit can have the following components:
- a first inverting amplifier for receiving the first input signal R and providing a signal −R;
- a second inverting amplifier for receiving the second input signal L and providing a signal −L;
- a first summing amplifier for receiving −R and L signals and producing a signal a(R−L);
- a second summing amplifier for receiving −R and −L signals and producing a signal a(R+L); and
- a third summing amplifier for receiving −L and R signals and producing a signal a(L−R), where a is a constant.

In an exemplary digital implementation, the circuit can include a digital signal processor (DSP) to perform the following functions:
- receive a first input signal R and a second input signal L;
- provide a first signal based on (R−L) to the first output wire;
- provide a second signal based on (R+L) to the second output wire; and provide a third signal based on (L−R) to the third output wire.

The digital implementation can also include analog-to-digital converters (ADC) for receiving analog input signals for processing in the DSP. The digital implementation can also include digital-to-analog converters (DAC) to convert digital signals to analog output signals.

As another example, the invention teaches a circuit that includes a first output wire, a second output wire, and a third output wire. The circuit receives a first input signal R and a second input signal L and provides three driving signals to the three output wires. A first driving signal is provided to the first output wire, the first driving signal based on a difference between the first input signal and the second input signal. A second driving signal is provided to the second output wire, the second driving signal based on a sum of the first input signal and the second input signal. A third driving signal is provided to the third output wire, the third driving signal based on an inverse of the difference between the first input signal and the second input signal. The circuit provides a first output signal between the first output wire and the second output wire, the first output signal based on twice the second input signal. The circuit also provides a second output signal between the third output wire and the second output wire, the second output signal based on twice the first input signal.

As yet another example, the invention teaches a stereo audio system. The system includes a first input audio signal R, a second input audio signal L, and a driver circuit having a first output wire, a second output wire, and a third output wire. The driver circuit receives a first input signal R and a second input signal L, and provides three driving signals to the three output wires. A first driving signal is provided to the first output wire, and the first driving signal is based on a difference between the first input signal and the second input signal. A second driving signal is provided to the second output wire, and the second driving signal is based on a sum of the first input signal and the second input signal. A third driving signal is provided to the third output wire, and the third driving signal is based on the difference between the first input signal and the second input signal. The audio system also has a first speaker having a positive terminal coupled to the first output wire and a negative terminal coupled to the second output wire, and a second speaker having a positive terminal coupled to the third output wire and a negative terminal coupled to the second output wire. The first speaker receives a first output signal based on twice the second input signal 2L, and the second speaker is configured to receive a second output signal based on twice the first input signal 2R.

As yet another example, the invention teaches a method for providing stereo audio output signals. The method includes receiving a first input signal R and a second input signal L, and providing three driving signals to the three output wires. A first driving signal is provided to the first output wire, and the first driving signal is based on a difference between the first input signal and the second input signal. A second driving signal is provided to the second output wire, and the second driving signal is based on a sum of the first input signal and the second input signal. A third driving signal is provided to the third output wire, and the third driving signal is based on the difference between the first input signal and the second input signal. The method also includes providing a first output signal based on 2L between the first output wire and the second output wire, and providing a second output signal based on 2R between the third output wire and the second output wire.

Definitions

The terms used in this disclosure generally have their ordinary meanings in the art within the context of the invention. Certain terms are discussed below to provide additional guidance to the practitioners regarding the description of the invention. It will be appreciated that the same thing may be said in more than one way. Consequently, alternative language and synonyms may be used.

A 3-wire stereo audio speaker system refers to two speakers having three wires for connecting to the left channel and right channel of a stereo audio signal, and a common wire. For example, a TRS (tip ring sleeve) audio jack, e.g., a 3.5 mm jack, which connects stereo audio signals to a speaker or headphone, has three contacts: one for the right channel audio signal, one for the left channel audio signal, and a common contact. The common contact is usually connected to a common ground for both channels in conventional 3-wire speakers.

A stereo sound refers a method of sound reproduction that uses two or more independent audio channels through a configuration of two or more loudspeakers (or stereo headphones) to create multi-directional audible perspective.

A speaker or loudspeaker refers to a device for transforming electric signals into audible sound, most frequently used to reproduce speech and music. In a mobile device, a headphone or ear buds can have built-in speakers.

An audio signal is a representation of sound, typically as an electrical voltage. Audio signals have frequencies in the audio frequency range of roughly 20 to 20,000 Hz, representing the limits of human hearing.

A blocking capacitor or a DC blocking capacitor is a capacitor used for stopping the passage of direct current signals from one circuit to another while allowing alternating current to pass. A blocking capacitor and a resistor form a high-pass filter that attenuates low-frequency signals. A high-pass filter can be characterized by a cutoff frequency where the signal is reduced by 3 dB.

An operational amplifier (op-amp or opamp) refers to a DC-coupled high-gain electronic voltage amplifier with a differential input and, usually, a single-ended output. An operational amplifier can be characterized by a high input impedance and a low output impedance, and can be used to perform mathematical operations in analog circuits.

A summing amplifier refers to an operational amplifier circuit configured to combine the voltages present on two or more inputs into a single output voltage.

An inverting amplifier refers to an operational amplifier circuit configured to produce an output voltage that is an inverse of the input voltage.

A power amplifier (audio power amplifier or power amp) refers to an electronic amplifier that amplifies low-power electronic audio signals such as the signal from radio receiver to a level that is strong enough for driving (or powering) loudspeakers or headphones.

A linear function of a signal S can be expressed as aS+b, where a and b are constant, where a is an amplification factor and b is an offset.

A digital signal processor refers to a specialized processor (or a system-in-a-package), optimized for the operational needs of digital signal processing.

DETAILED DESCRIPTION OF THE INVENTION

Figure 4:
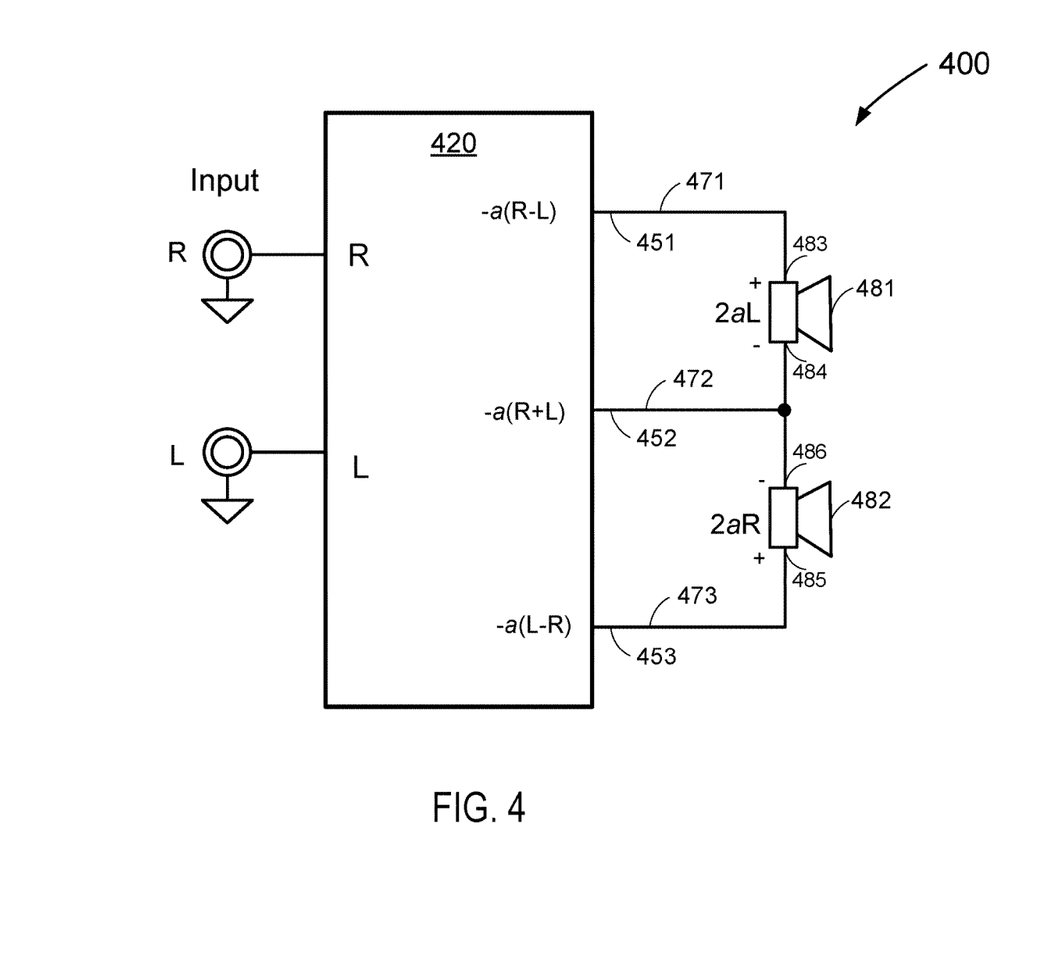
FIG. 4 is a simplified block diagram illustrating a stereo audio system according to some embodiments of the present invention.

FIG. 4 is a simplified block diagram illustrating a stereo audio system according to some embodiments of the present invention. Stereo audio system 400 receives two input audio signals R and L. For example, R and L can represent audio input signals for the right channel and left channel of the stereo system, respectively. Audio system 400 includes a driver circuit 420, also referred to as a signal process unit. Audio system 400 also has three output wires 471, 472, and 473 coupled to two speakers 481 and 482. Speaker 481 receives an output signal that is a linear function of the input signal L and not a function of the input signal R, and is shown as 2aL in FIG. 4, with a being a constant. Speaker 482 receives an output signal that is a linear function of the input signal R and not a function of the input signal L, and is shown as 2aR in FIG. 4, with a being a constant. In the case where a=1, speakers 481 and 482 receive output signals 2L and 2R, respectively, which represent twice the voltage signals of input audio signals R and L, respectively. Note that, in some embodiments, speakers 481 and 482 can receive amplified versions of signals 2L and 2R, or signals that are proportional to signals 2L and 2R, respectively, depending on the amplifier design and application of the system.

In audio system 400, driver circuit 420 receives first input signal R and second input signal L. Driver circuit 420 provides to the first output wire 471 a first driving signal 451. Driver circuit 420 also provides to the second output wire 472 a second driving signal 452. Driver circuit 420 also provides to the third output wire 473 a third driving signal 453. The first driving signal 451 is based on a difference between the first input signal R and the second input signal L, shown as -a(R-L) with a being a constant, which can represent a linear function of the difference between the input signal R and the input signal L. In a specific example with a=1, the first driving signal 451 is -(R-L), which is equivalent to L-R. The second driving signal 452 is based on a sum of the first input signal and the second input signal, which is shown as -a(R+L) with a being a constant as described above, which can represent a linear function of the sum of the input signal R and the input signal L. The third driving signal 453 has a magnitude of the first driving signal and has an opposite polarity with respect to the first driving signal. It is understood that the specific magnitudes and polarities for signals 451, 452, and 453 in FIG. 4 are shown for illustration only. The magnitudes and polarities of the signals can be varied depending on the application and system design. For example, the signal based on a difference between the first input signal R and the second input signal L can be (R-L), (L-R), or amplified versions of these signals, or inverse of these signals, or signals that are proportional to these signals.

In audio system 400, the first speaker 481 has a positive terminal 483 coupled to the first output wire 471 and a negative terminal 484 coupled to the second output wire 472. The second speaker 482 has a positive terminal 485 coupled to the third output wire 473 and a negative terminal 486 coupled to the second output wire 472. The first speaker 481 receives a first output signal that is a linear function of the input signal L and not a function of the input signal R. The second speaker 482 receives a second output signal that is a linear function of the input signal R and not a function of the input signal L.

As shown in FIG. 4, audio system 400 includes speakers connected between two audio amplifier outputs (not shown in FIG. 4). However, unlike conventional BTL audio systems which require four output wires, audio system 400 only needs three wires for connecting to two speakers to form a stereo audio system. Further, conventional BTL audio systems require four power amplifiers, whereas audio system 400 requires only three power amplifiers (not shown in FIG. 4). As a result, system cost and complexity can be reduced.

Figure 5:
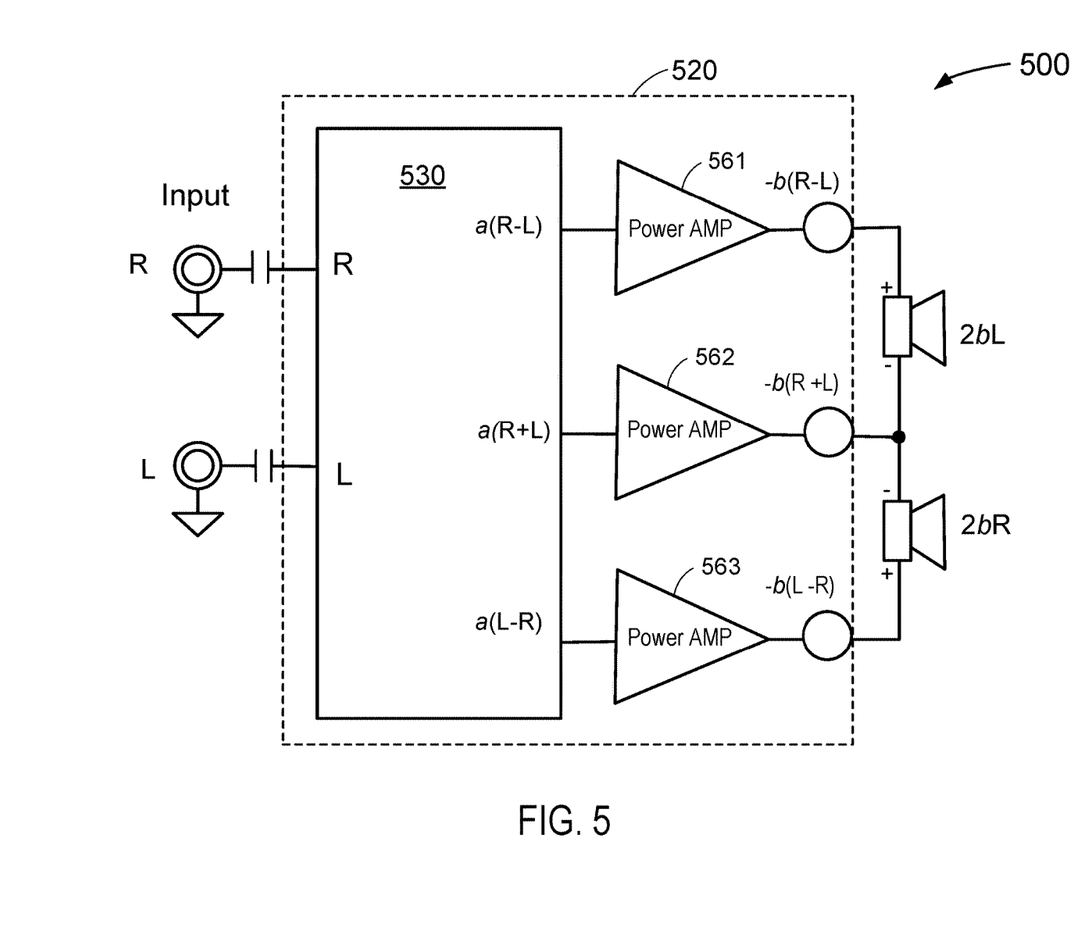
FIG. 5 is a simplified block diagram illustrating another audio system according to some embodiments of the present invention.

FIG. 5 is a simplified block diagram illustrating another stereo audio system according to some embodiments of the present invention. Similar to audio system 400 of FIG. 4, audio system 500 has a driver circuit 520 to receive two input audio signals R and L for the right and left channels, respectively. Audio system 500 has three output wires coupled to two speakers to receive two output signals.

Audio system 500 also has a signal process circuit 530 and three amplifiers 561, 562, and 563. Signal process circuit 530 receives input signals R and L, and produces output signals a(R-L), a(R+L), and a(L-R), with a being a constant as described above in connection to FIG. 4. Three amplifiers 561, 562, and 563, each with an amplification of nominally -1×, convert signals a(R-L), a(R+L), and a(L-R) to signals -b(R-L), -b(R+L), and -b(L-R), respectively, where b is another constant. Audio system 500 has three output wires coupled to two speakers to receive two output signals 2bL and 2bR, respectively. Different implementations of signal process circuit 530 are described below in connection with FIGS. 6 and 7.

Figure 6:
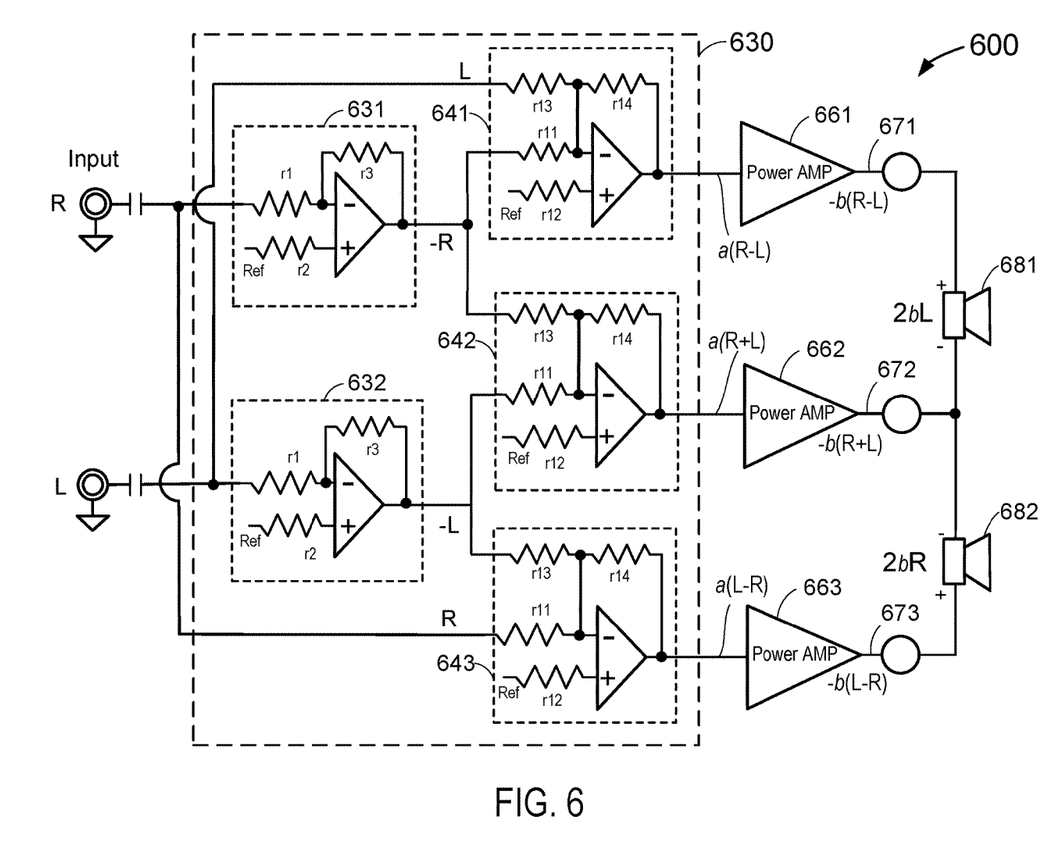
FIG. 6 is a schematic diagram illustrating another audio system according to some embodiments of the present invention.

FIG. 6 is a schematic diagram illustrating another stereo audio system according to some embodiments of the present invention. Similar to audio system 500 of FIG. 5, audio system 600 has two input audio signals R and L for the right and left channels, respectively. Audio system 600 also has three output wires coupled to two speakers to receive output signals 2bL and 2bR, respectively. Further, audio system 600 also has a signal process circuit 630 and three amplifiers 661, 662, and 663. Signal process circuit 630 receives input signals R and L, and produces output signals a(R-L), a(R+L), and a(L-R). Three amplifiers 661, 662, and 663, each converts signals a(R-L), a(R+L), and a(L-R) to signals -b(R-L), -b(R+L), and -b(L-R), respectively.

Signal processing circuit 630 includes analog circuit blocks based on operational amplifiers, for example, inverting amplifiers and summing amplifiers. A first inverting amplifier 631 and a second inverting amplifier 632 each includes an operational amplifier and three resistors configured to provide an inverse signal of the input signal. The first inverting amplifier 631 receives input audio signal R and provides a -R signal. The second inverting amplifier 632 receives input audio signal L and provides a -L signal. In the example of FIG. 6, each inverting amplifier includes an operational amplifier, a first resistor r1 for coupling an input signal to a negative input terminal of the operational amplifier, a second resistor r2 for coupling a reference signal Ref to a positive input terminal of the operational amplifier, and a third resistor r3 for coupling the negative input terminal to an output terminal of the operational amplifier. In a specific example, r1, r2, and r3 can have the same resistance value.

Signal processing circuit 630 also includes three summing amplifiers. A first summing amplifier 641 receives signals -R and L and produces an output signal a(R-L), where a is a constant, as described above. A second summing amplifier 642 receives signals -R and -L and produces an output signal a(R+L). Similarly, a third summing amplifier 643 receives signals −L and R and produces an output signal a(L−R). In this example, each summing amplifier includes an operational amplifier, a first resistor r11 for coupling a first input signal to a negative input terminal of the operational amplifier, a second resistor r12 for coupling a reference Ref signal to a positive input terminal of the operational amplifier, a third resistor r13 for coupling a second input signal to the negative input terminal of the operational amplifier, and a fourth resistor r14 for coupling the negative input terminal to an output terminal of the operational amplifier. In a specific example, r11, r12, r13, and r4 can have the same resistance value.

In audio system 600, a first power amplifier 661 receives the a(R−L) signal to produce a −b(R−L) signal at the first output wire 671, where b is a constant. A second power amplifier 662 receives the R+L signal to produce a −b(R+L) signal at the second output wire 672. Similarly, a third power amplifier 663 receives the a(L−R) signal to produce a −b(L−R) signal at the third output wire 673. (A −1× amplifier converts a(L−R) to −a(L−R))

The first speaker 681 receives signals −b(R−L) and −b(R+L) at its positive and negative input terminals, respectively, for a total signal of 2bL. Similarly, the second speaker 682 receives signals −b(L−R) and −b(R+L) at its positive and negative input terminals, respectively, for a total signal of 2bR.

The audio system 600 of FIG. 6 is an example of an audio circuit that can provide stereo output signals to two speakers using only three wires and without any output blocking capacitors. Compared with the conventional BTL system of FIG. 3, audio system 600 of FIG. 6 only requires three output wires. Further, audio system 600 of FIG. 6 only needs three power audio amplifiers, as compared with the conventional BTL system of FIG. 3 that needs four power audio amplifiers. Audio system 600 of FIG. 6 includes several operational amplifiers for performing mathematical functions with the audio signals, these operational amplifiers are much smaller and less costly than a conventional audio power amplifier. Therefore, when implemented with integrated circuits, audio system 600 of FIG. 6 can provide the additional advantage of being a smaller and less costly device.

Figure 7:
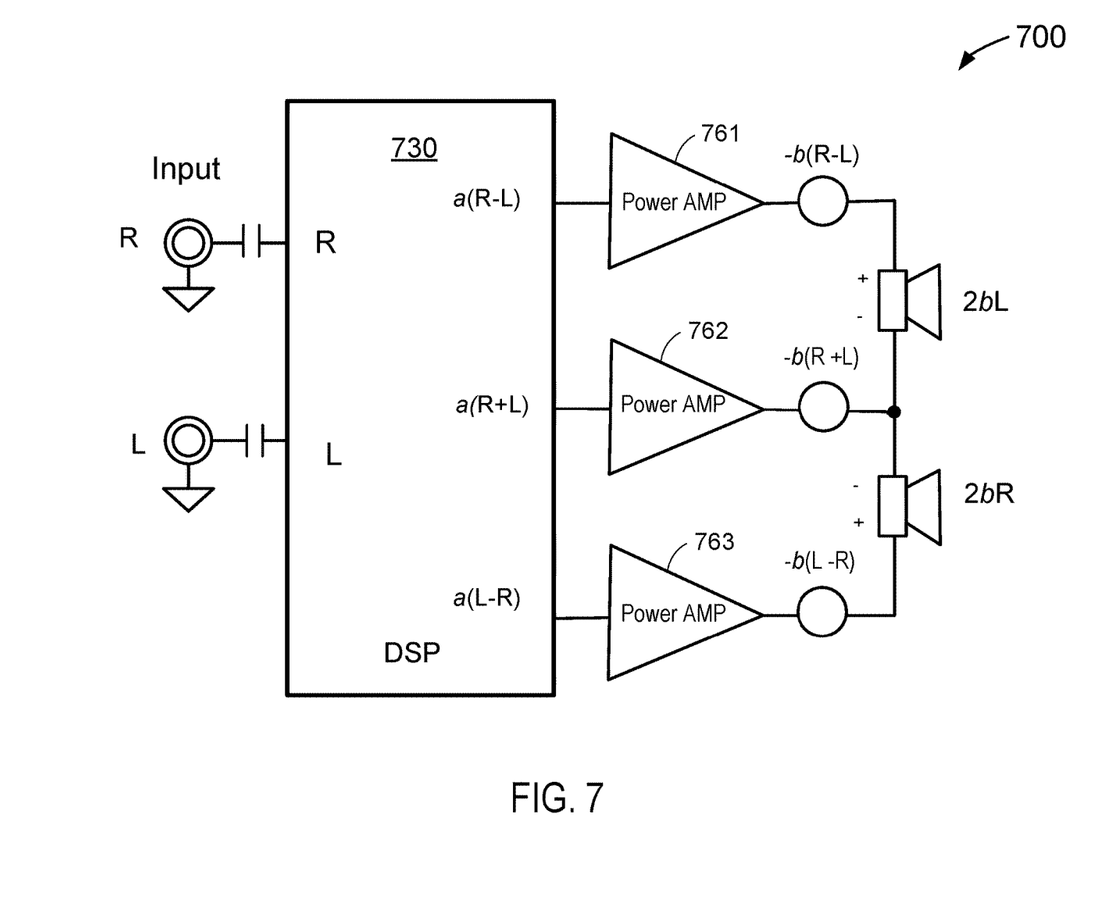
FIG. 7 is a schematic diagram illustrating another audio system according to some embodiments of the present invention.

FIG. 7 is a schematic diagram illustrating another stereo audio system according to some embodiments of the present invention. Audio system 700 has components similar to system 600, except the signal processing circuit. Audio system 700 has a digital signal processor (DSP) 730 that performs functions similar to analog signal processing circuit 630 illustrated in FIG. 6. Digital signal processor (DSP) 720 can include ADC to convert audio input signals R and L to digital signals, and process these digital signals to produce digital output signal a(R−L), a(R+L), and a(L−R), and DAC to convert these digital signals to analog output signals a(R−L), a(R+L), and a(L−R). Three amplifiers 761, 762, and 763 convert signals a(R−L), a(R+L), and a(L−R) to signals −b(R−L), −b(R+L), and −b(L−R), respectively.

Figure 8:
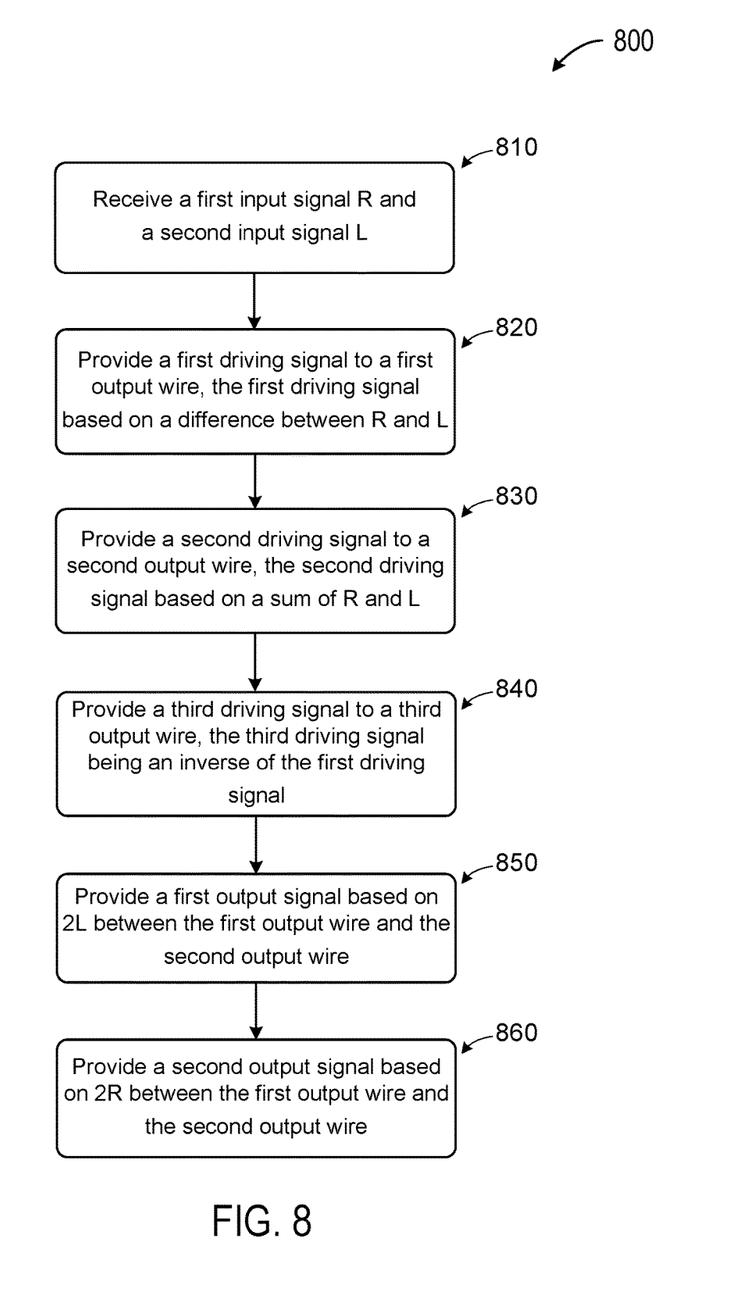
FIG. 8 is a flowchart illustrating a method for providing stereo audio output signals.

FIG. 8 is a flowchart illustrating a method for providing a three-wire stereo audio output signal. The method includes receiving a first input signal R and a second input signal L (Step 810). The method also includes providing a first driving signal to a first output wire, the first driving signal being based on a difference between the first input signal and the second input signal (Step 820). At step 830, a second driving signal is provided to a second output wire, the second driving signal being based on a sum of the first input signal and the second input signal. At step 840, a third driving signal is provided to a third output wire, the third driving signal being an inverse of the first driving signal. The method further includes providing a first output signal based on 2L between the first output wire and the second output wire (Step 850), and providing a second output signal based on 2R between the third output wire and the second output wire (Step 860).

Method 800 as outlined above can be implemented in connection to system 400 of FIG. 4, system 500 of FIG. 5, system 600 of FIG. 6, or system 700 of FIG. 7. For example, method 800 can be implemented using analog signal processing circuits as described in system 600 of FIG. 6. Alternatively, method 800 can be implemented using digital signal processing techniques as described in system 700 of FIG. 7.

What is claimed is:

1. A circuit, comprising:
a first output wire, a second output wire, and a third output wire, wherein the circuit is configured to:
receive a first input signal R and a second input signal L;
provide a first driving signal to the first output wire, the first driving signal being a linear function of the difference between the input signal R and the input signal L;
provide a second driving signal to the second output wire, the second driving signal being a linear function of the sum of the input signal R and L; and
provide a third driving signal to the third output wire, the third driving signal having a magnitude of the first driving signal and having an opposite polarity with respect to the first driving signal;
provide a first output signal between the first output wire and the second output wire, the first output signal being a linear function of the input signal L and not a function of the input signal R; and
provide a second output signal between the third output wire and the second output wire, the second output signal being a linear function of the input signal and not a function of the input signal L;
wherein the circuit is configured to:
provide a first driving signal −a(R−L) to the first output wire;
provide a second driving signal −a(R+L) to the second output wire; and
provide a third driving signal −a(L−R) to the third output wire, where a is a constant;
wherein the circuit is configured to:
provide a first output signal 2bL between the first output wire and the second output wire; and
provide a second output signal 2bR between the third output wire and the second output wire, where b is a constant;
wherein the circuit comprises:
a first inverting amplifier for receiving the first input signal R and providing a signal −R;
a second inverting amplifier for receiving the second input signal L and providing a signal −L;
a first summing amplifier for receiving −R and L signals and producing a signal a(R−L);
a second summing amplifier for receiving −R and −L signals and producing a signal a(R+L); and
a third summing amplifier for receiving −L and R signals and producing a signal a(L−R).

2. The circuit of claim 1, wherein:
the first output wire is configured to be coupled to a positive terminal of a first speaker;

the second output wire is configured to be coupled to a negative terminal of the first speaker and to a negative terminal of a second speaker; and the third output wire is configured to be coupled to a positive terminal of the second speaker, whereby the circuit is configured to:

provide a first output signal based on 2bL to the first speaker without blocking capacitors; and provide a second output signal based on 2bR to the second speaker without blocking capacitors being connected to the speakers.

3. The circuit of claim 1, wherein the circuit further comprises:

a first power amplifier configured to receive the signal a(R−L) from the first summing amplifier and to produce a signal −b(R−L) to the first output wire;

a second power amplifier configured to receive the signal a(R+L) from the second summing amplifier and to produce a signal −b(R+L) to the second output wire; and a third power amplifier configured to receive the signal a(L−R) from the third summing amplifier and to produce a signal −b(L−R) to the third output wire.

4. The circuit of claim 1, wherein the circuit comprises a digital signal processor configured to:

receive a first input signal R and a second input signal L;

provide a first signal a(R−L) to the first output wire;

provide a second signal a(R+L) to the second output wire; and provide a third signal a(L−R) to the third output wire.

5. The circuit of claim 1, wherein the circuit further comprises:

a first power amplifier configured to receive the first signal a(R−L) from the digital signal processor and to produce a signal −b(R−L) to the first output wire;

a second power amplifier configured to receive the second signal a(R+L) from the digital signal processor and to produce a signal −b(R+L) to the second output wire; and a third power amplifier configured to receive the third signal a(L−R) from the digital signal processor and to produce a signal −b(L−R) to the third output wire.

6. A circuit, comprising:

a first output wire, a second output wire, and a third output wire, wherein the circuit is configured to:

receive a first input signal R and a second input signal L;

provide a first driving signal to the first output wire, the first driving signal based on a difference between the first input signal and the second input signal;

provide a second driving signal to the second output wire, the second driving signal based on a sum of the first input signal and the second input signal;

provide a third driving signal to the third output wire, the third driving signal based on an inverse of the difference between the first input signal and the second input signal;

wherein the circuit is configured to:

provide a first output signal between the first output wire and the second output wire; and provide a second output signal between the third output wire and the second output wire;

wherein the circuit comprises:

a first inverting amplifier for receiving the first input signal R and providing a signal −R;

a second inverting amplifier for receiving the second input signal L and providing a signal −L;

a first summing amplifier for receiving −R and L signals and producing a signal a(R−L);

a second summing amplifier for receiving −R and −L signals and producing a signal a(R+L); and a third summing amplifier for receiving −L and R signals and producing a signal a(L−R), where a is a constant.

7. The circuit of claim 6, wherein the circuit further comprises:

a first power amplifier configured to receive the signal a(R−L) from the first summing amplifier and to produce a signal −b(R−L) to the first output wire;

a second power amplifier configured to receive the signal a(R+L) from the second summing amplifier and to produce a signal −b(R+L) to the second output wire; and a third power amplifier configured to receive the signal a(L−R) from the third summing amplifier and to produce a signal −b(L−R) to the third output wire.

8. The circuit of claim 6, wherein the circuit comprises a digital signal processor configured to:

receive a first input signal R and a second input signal L;

provide a first signal based on a(R−L) to the first output wire;

provide a second signal based on a(R+L) to the second output wire; and provide a third signal based on a(L−R) to the third output wire, where a is a constant.

9. The circuit of claim 8, wherein the circuit further comprises:

a first power amplifier configured to receive the signal a(R−L) from the digital signal processor and to produce a signal −b(R−L) to the first output wire;

a second power amplifier configured to receive the signal a(R+L) from the digital signal processor and to produce a signal −b(R+L) to the second output wire; and a third power amplifier configured to receive the signal a(L−R) from the digital signal processor and to produce a signal −b(L−R) to the third output wire.

10. A stereo audio system, comprising:

a first input audio signal R;

a second input audio signal L;

a driver circuit having a first output wire, a second output wire, and a third output wire, wherein the driver circuit is configured to:

receive the first input audio signal R and the second input audio signal L;

provide a first driving signal to the first output wire, the first driving signal based on a difference between the first input audio signal and the second input audio signal;

provide a second driving signal to the second output wire, the second driving signal based on a sum of the first input audio signal and the second input audio signal;

provide a third driving signal to the third output wire, the third driving signal based on an inverse of the difference between the first input audio signal and the second input audio signal;

a first speaker having a positive terminal coupled to the first output wire and a negative terminal coupled to the second output wire;

a second speaker having a positive terminal coupled to the third output wire and a negative terminal coupled to the second output wire;

whereby:

the first speaker is configured to receive a first output signal based on twice the second input audio signal 2L; and the second speaker is configured to receive a second output signal based on twice the first input audio signal 2R;

wherein the driver circuit comprises:

a first inverting amplifier for receiving the first input audio signal R and providing a signal −R;

a second inverting amplifier for receiving the second input audio signal L and providing a signal −L;

a first summing amplifier for receiving −R and L signals and producing a signal (R−L);

a second summing amplifier for receiving −R and −L signals and producing a signal (R+L); and a third summing amplifier for receiving −L and R signals and producing a signal (L−R).

11. The system of claim 10, wherein the driver circuit further comprises:

a first power amplifier with an amplification of −1× and configured to receive the signal (R−L) from the first summing amplifier and to produce a signal −(R−L) to the first output wire;

a second power amplifier with an amplification of −1× and configured to receive the signal (R+L) from the second summing amplifier and to produce a signal −(R+L) to the second output wire; and a third power amplifier with an amplification of −1× and configured to receive the signal (L−R) from the third summing amplifier and to produce a signal −(L−R) to the third output wire.

* * * * *